United States Patent
Gu et al.

(10) Patent No.: US 6,833,743 B2
(45) Date of Patent: Dec. 21, 2004

(54) ADJUSTMENT OF A CLOCK DUTY CYCLE

(76) Inventors: Gong Gu, 1246 Cornell Rd., Bridgewater, NJ (US) 08807; Kadaba R. Lakshmikumar, 30 Landau Rd., Basking Ridge, NJ (US) 07920

(*) Notice: Subject to any disclaimer, the term of this patent is extended or adjusted under 35 U.S.C. 154(b) by 0 days.

(21) Appl. No.: 10/282,398

(22) Filed: Oct. 29, 2002

(65) Prior Publication Data

US 2004/0080350 A1 Apr. 29, 2004

(51) Int. Cl.$^7$ ............................................. H04L 25/06
(52) U.S. Cl. ..................... 327/175; 327/307; 327/157; 375/317
(58) Field of Search ............................ 327/172, 175, 327/307, 157, 362, 158, 554, 537; 375/317, 319

(56) References Cited

U.S. PATENT DOCUMENTS

| | | | |
|---|---|---|---|
| 4,644,196 A | | 2/1987 | Flannagan |
| 4,720,686 A | * | 1/1988 | Westwick ............... 330/258 |
| 4,724,337 A | | 2/1988 | Maeda et al. |
| 4,789,799 A | | 12/1988 | Taylor et al. |
| 4,992,757 A | | 2/1991 | Shin'e |
| 5,182,476 A | | 1/1993 | Hanna et al. |
| 5,572,158 A | | 11/1996 | Lee et al. |
| 6,047,031 A | * | 4/2000 | Allott et al. ............ 375/317 |
| 6,369,626 B1 | * | 4/2002 | Donnelly et al. ........ 327/157 |
| 6,384,652 B1 | | 5/2002 | Shu |
| 6,411,145 B1 | | 6/2002 | Kueng et al. |
| 6,426,660 B1 | | 7/2002 | Ho et al. |

FOREIGN PATENT DOCUMENTS

| | | |
|---|---|---|
| DE | 3816973 A1 | 11/1989 |
| DE | 40 18 615 A1 | 12/1990 |
| EP | 0 343 899 A2 | 11/1989 |

OTHER PUBLICATIONS

Patent Abstracts of Japan, JP 61228720, "Voltage Controlled Oscillator" (Nov. 10, 1986).
Patent Abstracts of Japan, JP 4010810, "FM Modulator" (Jan. 16, 1992).
Joonsuk Lee et al., "A Low–Noise Fast–Lock Phase–Locked Loop with Adaptive Bandwidth Control," IEEE J. of Solid–State Circuits, vol. 35, No. 8, pp. 1137–1145 (Aug. 2000).
W. Dally et al., *Digital Systems Engineering*, Cambridge University, pp. 606–607 (1998).
N. Nakamura et al., "A CMOS 50% Duty Cycle Repeater Using Complementary Phase Bending," 2000 Symposium on VLSI Circuits Digest of technical papers, pp. 48–49 (2000).
P. Yang et al., "Low–voltage Pulsewidth Control Loops for SOC Applications," IEEE J. of Solid–State Circuits, vol. 37, No. 10, pp. 1348–1351 (Oct. 2002).

\* cited by examiner

*Primary Examiner*—Dinh T. Le
(74) *Attorney, Agent, or Firm*—Fish & Richardson, P.C.

(57) ABSTRACT

Circuits for adjusting the duty cycle of a clock(s) signal include a negative feedback loop for applying an offset signal to the uncorrected clock signal(s). The offset signal, which corresponds to a duty cycle error of the corrected clock signal(s), adjusts the slicing level of the uncorrected clock signal(s) to cause the duty cycle error to converge toward a predetermined value, for example, zero. The techniques may be used to adjust the duty cycle error of differential clock signals as well as single-ended clock signals.

18 Claims, 3 Drawing Sheets

US 6,833,743 B2

ADJUSTMENT OF A CLOCK DUTY CYCLE

BACKGROUND

The present disclosure relates to adjustment of a clock duty cycle.

Clock signals may be used in electronic circuits to provide timing information. An important aspect of a clock signal in many applications is the clock duty cycle, which may be defined as the ratio of the time the clock pulse is at a high level to the clock period. For example, a clock signal that is at the high level for one-half of the clock period and the low level for one half the clock period has a 50% duty cycle.

A 50% duty cycle is desirable for many applications. For example, in clock-driven digital systems requiring high speed operation, both the rising and falling edges of the clock signal may be used to increase the total number of operations. Such systems may require a 50% duty cycle to help prevent or reduce jitter and other timing related distortions. In such systems, the duty cycle may be critical to proper performance of the system. Unfortunately, the duty cycle of the clock signal may become distorted or degraded, for example, as a result of semiconductor process errors. Other conditions also may cause the duty cycle to deviate from the desired value. Duty cycle correction circuits may be used to correct or adjust such distortions.

SUMMARY

Circuits for adjusting the duty cycle of a clock(s) signal include a negative feedback loop for applying an offset signal to the uncorrected clock signal(s). The offset signal, which corresponds to a duty cycle error of the corrected clock signal(s), adjusts the slicing level of the uncorrected clock signal(s) to cause the duty cycle error to converge toward a predetermined value, for example, zero. The techniques may be used to adjust the duty cycle error of differential clock signals as well as single-ended clock signals.

In various implementations, the feedback loop may include a charge pump and an integrator to receive an output from the charge pump. A net charge in the integrator may correspond to the duty cycle error. A driver may be provided to amplify and clamp the values of the clock signals after applying a DC offset signal to the uncorrected clock signal(s).

Various implementations may include one or more of the following advantages. For example, the circuits may be used to correct a signal having an arbitrary duty cycle to a signal having the same frequency with a 50% duty cycle. Use of an integrator in the feedback loop may allow the gain to be sufficiently large to minimize or reduce the duty cycle error.

Other features and advantages will be readily apparent from the following detailed description, the accompanying drawings and the claims.

DETAILED DESCRIPTION

Figure 1:
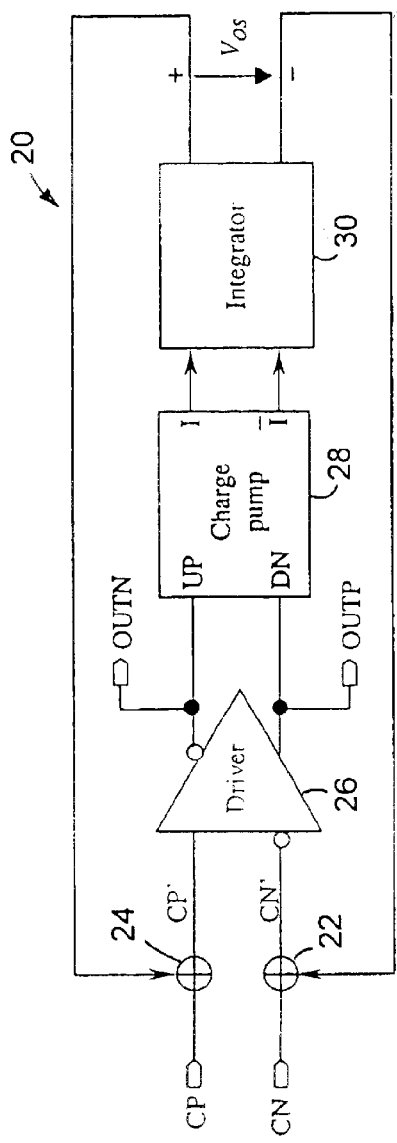
FIG. 1 is a diagram of a circuit for adjusting the duty cycle of differential clock signals.

As shown in FIG. 1, a circuit 20 may be used to adjust the differential duty cycle for a pair of clock signals (CN, CP). In particular, the circuit 20 may be used to correct the differential duty cycle and cause it to converge toward 50%.

The circuit uses a negative feedback configuration that adds a DC offset signal (VOS) to the uncorrected clock signals (CN, CP). The DC offset voltage (VOS) may be added to the input clock signals using summers 22, 24, to produce corrected clock signals, CN' and CP', respectively.

The corrected clock signals (CN', CP') are applied as inputs to a driver 26 which forms part of the feedback loop. The output signals (OUTN, OUTP) from the driver 26 represent the clock signals with the corrected differential duty cycle. The driver may provide a high gain and may clamp the maximum amplitude of the output clock signals at a fixed value to prevent amplitude variation.

The feedback loop also includes a differential charge pump 28 and integrator 30 which together produce an error voltage proportional to the duty cycle error. The output clock signals from the driver 26 are applied, respectively, to input terminals (UP, DN) of the charge pump. When the signal at the terminal UP is a high level signal and the signal at the terminal DN is a low level signal, the charge pump sources a current $I_{UP}$ from one output (I) and sinks substantially the same amount of current into the second output $\bar{I}$. Conversely, when the signal at the terminal input UP is a low level signal and the signal at the terminal DN is a high level signal, the currents flow in the opposite direction—in other words, the charge pump sources a current IDN from the output $\bar{I}$ and sinks substantially the same amount of current into the output I. The outputs of the charge pump are indicative of the instantaneous time difference between the high and low states of the clock signals. For example, if the duty cycle of the clock signals were exactly 50%, the average net output of the charge pump would be about zero.

The current signals from the output terminals (I and $\bar{I}$) of the charge pump are applied as input signals to the integrator 30. The integrator may include capacitors (not shown in FIG. 1) which are charged and discharged depending on the output currents from the charge pump 28. The net charge on the capacitors is proportional to the integrated value of the deviation of the clock signals from a predetermined duty cycle, for example, a 50% duty cycle. The DC offset voltage (VOS) corresponds to the net charge and represents the duty cycle error of the differential clock signal (CP'−CN'). For example, if the differential duty cycle were exactly 50%, then the DC offset voltage ($V_{OS}$) would be about zero volts. On the other hand, as the duty cycle deviates from 50%, the DC offset voltage will vary as well. Applying the DC offset voltage signal to the input clock signals CN, CP adjusts the zero crossing point, or slicing level, of the input clock signals so that the differential duty cycle converges toward 50%.

Figure 2:
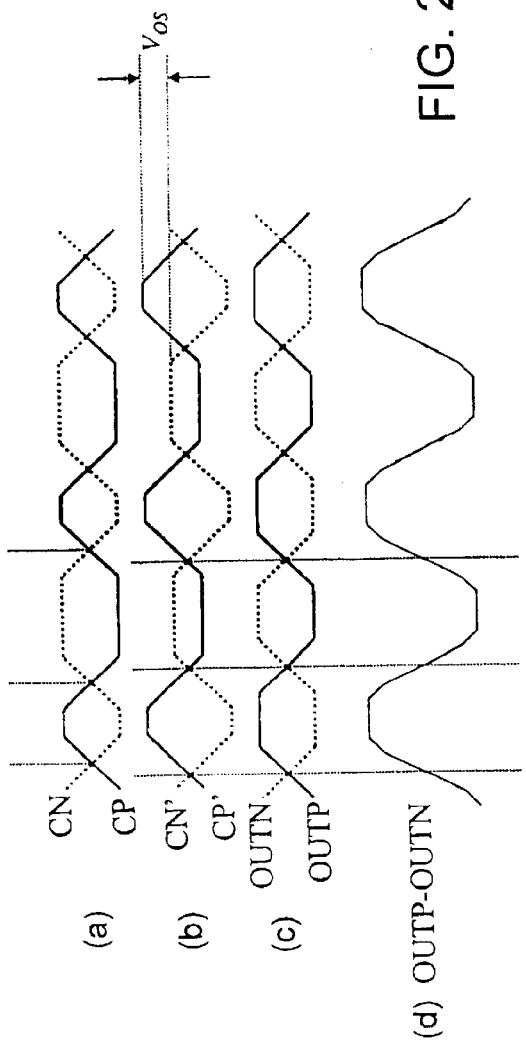
FIGS. 2(a) through 2(d) are examples of timing diagrams for FIG. 1.

FIG. 2(a) illustrate an example of a timing diagram in which it is assumed that the input clock signals have a duty cycle that deviates from 50%. In that case, the duty cycle of the differential clock signal (CP−CN) also will deviate from 50%. The feedback loop causes the offset voltage $V_{OS}$ to be applied to the input clock signals, effectively shifting the zero crossing (i.e., slicing level) of the clock signals, as illustrated in FIG. 2(b). Although each of the modified clock signals (CP', CN') has approximately a 50% duty cycle, the duty cycle of the differential clock signal (CP'-CN') may still deviate from 50% as a result of the amplitude variations in the modified clock signals. The driver 26 amplifies and clamps the modified clock signals to produce the output clock signals (OUTP, OUTN), as illustrated in FIG. 2(c). The output clock signals have approximately a 50% duty cycle. Furthermore, as shown by FIG. 2(d), the differential clock signal, OUTP-OUTN, also has approximately a 50% duty cycle.

Figure 3:
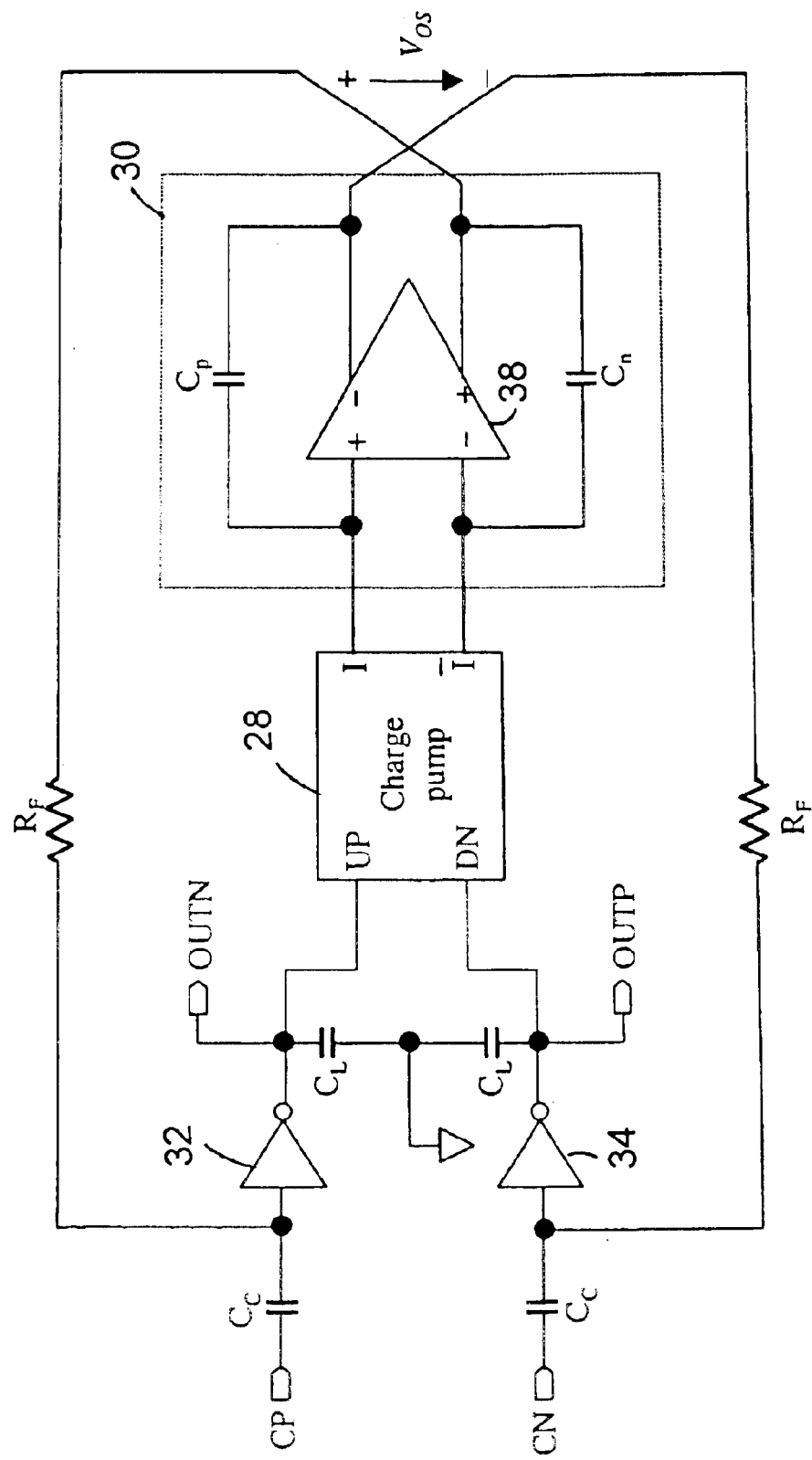
FIG. 3 illustrates further details of the circuit of FIG. 1 according to one implementation.

A particular implementation of the duty cycle correction circuit is shown in FIG. 3. In this implementation, the driver includes a pair of single-ended drivers, such as complementary metal oxide semiconductor (CMOS) inverters 32, 34. The input clock signals (CP, CN) may be AC-coupled through the respective capacitors $C_c$ to the CMOS inverters which drive external loads shown as a pair of capacitors $C_L$. The input to each inverter is the sum of the offset voltage ($V_{OS}$) and the corresponding uncorrected clock signal.

In other embodiments, the driver 26 may be implemented as a differential amplifier.

Figure 4:
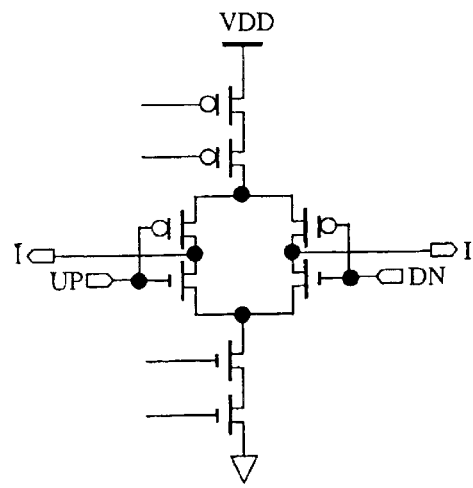
FIG. 4 illustrates details of a charge pump that may be used in the circuit of FIG. 1 according to one particular implementation.

The charge pump 28 may operate at the input clock rate. One specific implementation of the charge pump is illustrated in FIG. 4 and includes a p-type MOS current source, an n-type MOS current sink, and CMOS switches to direct the currents. Other types of charge pumps may be used as well.

The integrator 30 may be implemented as a passive integrator including one or more capacitors. Alternatively, as shown in FIG. 3, the feedback loop may include an active integrator. In the implementation of FIG. 3, the active integrator 30 includes a differential operational amplifier 38 and feedback capacitors $C_p$, $C_n$. The output clock signals (OUTP, OUTN) drive the charge pump 28, which charges and discharges the capacitors $C_p$, $C_n$. The active integrator keeps the potentials of the output terminals of the charge pump substantially equal to one another. The charge pump output currents may, therefore, be independent of the duty cycle error, as well as the offset voltage ($V_{OS}$), thereby relaxing requirements on the charge pump. The integrator outputs are fed back through a pair of resistors RF to control the DC voltage across the AC-coupling capacitors $C_C$.

To ensure stability of the duty cycle correction loop, the values of the feedback capacitors $C_p$ and $C_n$ in the integrator should be large enough to provide sufficient phase margin.

In some applications, the input offset voltage ($V_{offset}$) of the operational amplifier 38 may cause a small duty cycle error in the output. The error in the output is proportional to the input offset voltage and is inversely proportional to the slew rate (r) and period (T) of the input signal. For example, assuming that the rise and fall times are one fourth the period—$r \cdot (T/4) = V_{DD} = 1.2$ volts—then an input offset voltage of 10 millivolts (mV) would result in an output duty cycle error or about only 0.4%.

Figure 5:
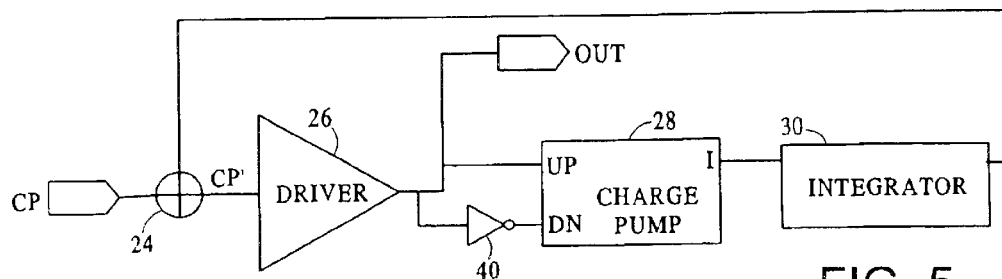
FIG. 5 is a diagram of a circuit for adjusting the duty cycle of a single-ended clock signal.

Although the particular circuits described above are illustrated in the context of differential clock signals, the techniques may be used for adjusting the duty cycle of a single-ended clock signal as well. As shown in FIG. 5, a negative feedback loop may be used to adjust the duty cycle of the single-ended clock signal CP and to cause it to converge toward 50%. The amplified clock output signal (OUT) from the driver 26 serves as the input to the UP terminal of the charge pump 28. The clock output signal (OUT) also may serve as the input to an inverter 40 whose output is provided to the DN terminal of the charge pump. The output current from the terminal (I) of the charge pump serves as the input to the integrator 30. The DC offset voltage at the output of the integrator represents the DC component of the clock signal (CP') which, in turn, corresponds to the duty cycle error. Feeding the DC offset voltage back to the summer 24 causes the duty cycle to converge toward 50%.

The foregoing techniques may be used for clock signals at high or low frequencies, but may be particularly advantageous for frequencies of 1.25 gigahertz ($GH_z$) and higher. The techniques may be useful, for example, in high-speed digital transmitters in which the output data is clocked by a double-edge-triggered (DET) flip-flop. The techniques may be used in other systems as well.

Other implementations are within the scope of the claims.

What is claimed is:

1. An apparatus comprising:

an input terminal to receive a clock signal;

a negative feedback loop to add an offset voltage at the input terminal, the feedback loop including:
 a charge pump coupled to the input terminal;
 an integrator to receive an output from the charge pump and provide the offset voltage; and
 circuitry to add the offset voltage to the clock signal at the input terminal, wherein the offset voltage corresponds to a duty cycle error in the clock signal and wherein adding the offset voltage adjusts a slicing level for the clock signal.

2. The apparatus of claim 1 wherein the negative feedback loop includes a driver coupled between the input terminal and the charge pump.

3. The apparatus of claim 2 wherein, during operation, the negative feedback loop causes a signal at an output of the driver to converge toward a duty cycle of about 50%.

4. The apparatus of claim 2 wherein, during operation, the negative feedback loop causes a signal at an output of the driver to converge toward a duty cycle error of about zero.

5. The apparatus of claim 2 wherein, during operation, the driver amplifies and clamps a signal received by the driver.

6. The apparatus of claim 1 wherein the integrator comprises a passive integrator.

7. The apparatus of claim 1 wherein the integrator comprises an active integrator.

8. An apparatus comprising:

input terminals to receive first and second clock signals;

a negative feedback loop to add an offset voltage at the input terminals, the feedback loop including:
 a charge pump coupled to the input terminal;
 an integrator to receive output signals from the charge pump and provide the offset voltage; and
 circuitry to add the offset voltage to the clock signals at the input terminals, wherein the offset voltage corresponds to a differential clock signal duty cycle error for the first and second clock signals and wherein addition of the offset voltage adjusts a slicing level for the clock signals.

9. The apparatus of claim 8 wherein the negative feedback loop includes a driver coupled between the input terminals and the charge pump.

10. The apparatus of claim 9 wherein, during operation, the negative feedback loop causes first and second output signals from the driver to converge toward a respective duty cycle of about 50%.

11. The apparatus of claim 10 wherein, during operation, the negative feedback loop causes a differential signal based on the first and second output signals to converge toward a duty cycle of about 50%.

12. The apparatus of claim 9 wherein the driver is for amplifying and clamping signals received by the driver.

13. The apparatus of claim 9 wherein the integrator comprises a passive integrator.

14. The apparatus of claim 9 wherein the integrator comprises an active integrator.

15. The apparatus of claim 9 wherein the integrator includes capacitive elements that, during operation, are charged and discharged based on the output signals from the charge pump.

16. The apparatus of claim 15 wherein, during operation, the offset voltage corresponds to the net charge on the capacitive elements.

17. The apparatus of claim 9 wherein the integrator includes a differential operational amplifier and feedback capacitors.

18. The apparatus of claim 17 wherein, during operation, the feedback capacitors are charged and discharged based on the output signals from the charge pump, and wherein the offset voltage corresponds to the net charge on the capacitors.

* * * * *